(12) United States Patent
West (10) Patent No.: US 7,973,327 B2
(45) Date of Patent: Jul. 5, 2011

(54) PHOSPHOR-CONVERTED LED

(75) Inventor: Scott West, Sunnyvale, CA (US)

(73) Assignee: Bridgelux, Inc., Livermore, CA (US)

( * ) Notice: Subject to any disclaimer, the term of this patent is extended or adjusted under 35 U.S.C. 154(b) by 131 days.

(21) Appl. No.: 12/202,793

(22) Filed: Sep. 2, 2008

(65) Prior Publication Data

US 2010/0051984 A1    Mar. 4, 2010

(51) Int. Cl.
*H01L 33/50* (2010.01)
*H01L 33/58* (2010.01)

(52) U.S. Cl. .... 257/98; 257/100; 257/789; 257/E33.074

(58) Field of Classification Search ........... 257/E33.055–E33.077, 701–707, 257/729, 79–103
See application file for complete search history.

(56) References Cited

U.S. PATENT DOCUMENTS

| 2005/0219835 A1* | 10/2005 | Nagayama | 362/84 |
| 2009/0212697 A1* | 8/2009 | Nakamura et al. | 313/506 |

FOREIGN PATENT DOCUMENTS

WO    WO 2007085977 A1 *    8/2007

* cited by examiner

*Primary Examiner* — Stephen W Smoot
(74) *Attorney, Agent, or Firm* — Calvin B. Ward (57) ABSTRACT

A light source and method for fabricating the same are disclosed. The light source includes a die, a light conversion component, and a scattering ring. The die emits light of a first wavelength through a top surface of the die and one or more side surfaces of the die, and is bonded to a mounting substrate. The light conversion component converts light of the first wavelength to light of a second wavelength, the light conversion component having a bottom surface bonded to the top surface of the die. The light conversion component has lateral dimensions such that a space exists around the die, the space being bounded by the substrate and the light conversion component. The scattering ring is positioned in the space such that a portion of the light emitted from the side surfaces of the die is scattered into the light conversion component.

8 Claims, 7 Drawing Sheets

PHOSPHOR-CONVERTED LED

BACKGROUND OF THE INVENTION

Light emitting diodes (LEDs) are attractive candidates for replacing conventional light sources such as incandescent lamps and fluorescent light sources. LEDs have substantially higher light conversion efficiencies than incandescent lamps and longer lifetimes than both types of conventional light sources. In addition, some types of LEDs now have higher conversion efficiencies than fluorescent light sources and still higher conversion efficiencies have been demonstrated in the laboratory. Finally, LEDs require lower voltages than fluorescent lamps, and hence, are better suited for applications in which the light source must be powered from a low-voltage source such as a battery or an internal computer DC power source.

Unfortunately, LEDs produce light in a relatively narrow spectral band. To replace conventional lighting systems, LED-based sources that generate light that appears to be "white" to a human observer are required. A light source that appears to be white and that has a conversion efficiency comparable to that of fluorescent light sources can be constructed from a blue LED that is covered with a layer of phosphor that converts a portion of the blue light to yellow light. Such light sources will be referred to as "phosphor converted" light sources in the following discussion. If the ratio of blue to yellow light is chosen correctly, the resultant light source appears white to a human observer. To provide the correct ratio, the thickness of the phosphor layer must be controlled. In addition, the uniformity of the phosphor layer over the die on which the LED is fabricated must be maintained to prevent variations in the color of the light over the light-emitting surface of the light source.

Cost, measured in terms of lumens of light produced per dollar, is an important concern in any light source that is directed to replacing conventional light sources. The cost of packaging the dies represents a significant fraction of the cost of the final light source. The packaging cost is increased by the need to capture light leaving the sides of the die. A significant fraction of the light produced in the blue LEDs used in phosphor converted light sources is trapped between the top and bottom surfaces of the die by internal reflection due to the difference in the index of refraction between the materials from which the dies are constructed and the surrounding medium. A significant fraction of this trapped light leaves the die through the sides of the die. To improve the light output of the die, a reflector is typically included in the light source to redirect the light leaving the side surfaces of the die such that the light leaves the die in the same direction as the light leaving the top surface of the die.

The packaging costs associated with providing a constant thickness of phosphor and a reflector are substantial. For example, in one design, the reflector is provided in the form of a cup that has reflective walls. The cup is mounted on a substrate that includes electrical traces for powering the die. A portion of the substrate is exposed through an opening in the bottom of the cup. The die is mounted on the portion of the substrate that is exposed through the bottom of the cup, and connected to the electrical traces. The cup is then filled with a suspension of phosphor particles in a material that can be cured to provide a solid layer of material in which the phosphor particles will remain suspended. Processes based on epoxy or silicone based materials for suspending the phosphor particles are known to the art.

These processes are difficult to automate in a manner that guarantees uniformity of the light emitted across the die. In particular, the fraction of the light that leaves the top surface of the die and is converted by the phosphor layer must be the same as the fraction of the light leaving the side surfaces of the die and is converted by the phosphor layer. In these processes, the phosphor layer is formed in the cup during the final assembly of the light sources on the light source assembly line by curing a carrier material that contains the phosphor particles. The phosphor particles tend to settle in the carrier material during the dispensing phase. To prevent the settling, the suspension must be augmented with various materials that slow the settling. In addition, the carrier must be formulated to provide a short curing time to prevent the particles from settling around the die in the cup. If the particles settle in the bottom of the cup, the amount of phosphor through which light leaving the sides of the die must pass is significantly different than the amount of phosphor through which the light leaving the top of the die must pass. As a result, the light that is redirected by the reflector has a different color than the light that leaves the top surface of the die. Hence, the light source exhibits a variation in color across the surface of the light source.

In addition, the process of providing individual cups for each die typically involves a number of additional fabrication steps. In the simplest designs, the cups are individually attached to the underlying substrate after the cups are fabricated. While designs in which the cups are created in a layer of material that is positioned over a number of dies have been suggested, the generation of the "cup layer" still represents a significant fraction of the cost of the final light source.

SUMMARY OF THE INVENTION

The present invention includes a light source and method for fabricating the same. The light source includes a die, a light conversion component and a scattering ring. The die emits light of a first wavelength through a top surface of the die and one or more side surfaces of the die, the die being bonded to a surface of a mounting substrate. The light conversion component includes a layer of luminescent material that converts light of the first wavelength to light of a second wavelength, the light conversion component having a bottom surface bonded to the top surface of the die. The light conversion component has lateral dimensions such that a space exists around the die, the space being bounded by the substrate and the light conversion component. The scattering ring surrounds the side surfaces of the die and is positioned in the space such that a portion of the light emitted from the side surfaces of the die is scattered into the light conversion component by the scattering ring. In one aspect of the invention, the scattering ring includes a transparent material having particles suspended therein. In another aspect of the invention, the light conversion component includes a planar layer of transparent material having a luminescent material therein and a light processing layer that includes a layer of transparent material bonded to the planar layer, the light processing layer having a non-planar surface overlying the planar layer.

The light sources can be fabricated in groups of light sources in which a plurality of dies that emits light of a first wavelength through a top surface of the die and one or more side surfaces of the die are mounted to a surface of a mounting substrate. A sheet of light conversion components, each light conversion component including a layer of luminescent material that converts light of the first wavelength to light of a second wavelength, is positioned over the mounting substrate. Each light conversion component corresponding to one of the dies and being aligned with that die such that a bottom surface of that light conversion component is positioned over the top surface of that die. The sheet of light conversion components is then bonded to the top surfaces of the dies. Each light conversion component has lateral dimensions chosen such that a space exists around the corresponding die, the space is bounded by the substrate and the corresponding light conversion component. A scattering ring surrounding the side surfaces of each die is then generated. The scattering ring is positioned in the space around the die such that a portion of the light emitted from the side surfaces of that die is scattered into the light conversion component corresponding to that die by the scattering ring. In one aspect of the invention, the scattering rings include a transparent material having particles suspended therein. The transparent material has a liquid precursor that wets the bottom surface of the light conversion component and a surface of the substrate. The scattering rings are generated by suspending the scattering particles in the liquid precursor to form a liquid ring precursor, introducing the liquid ring precursor into the spaces around the dies, and curing the liquid ring precursor to form the transparent medium in which the scattering particles are suspended. In another aspect of the invention, the liquid precursor is drawn into the space by capillary action.

DETAILED DESCRIPTION OF THE PREFERRED EMBODIMENTS OF THE INVENTION

Figure 1:
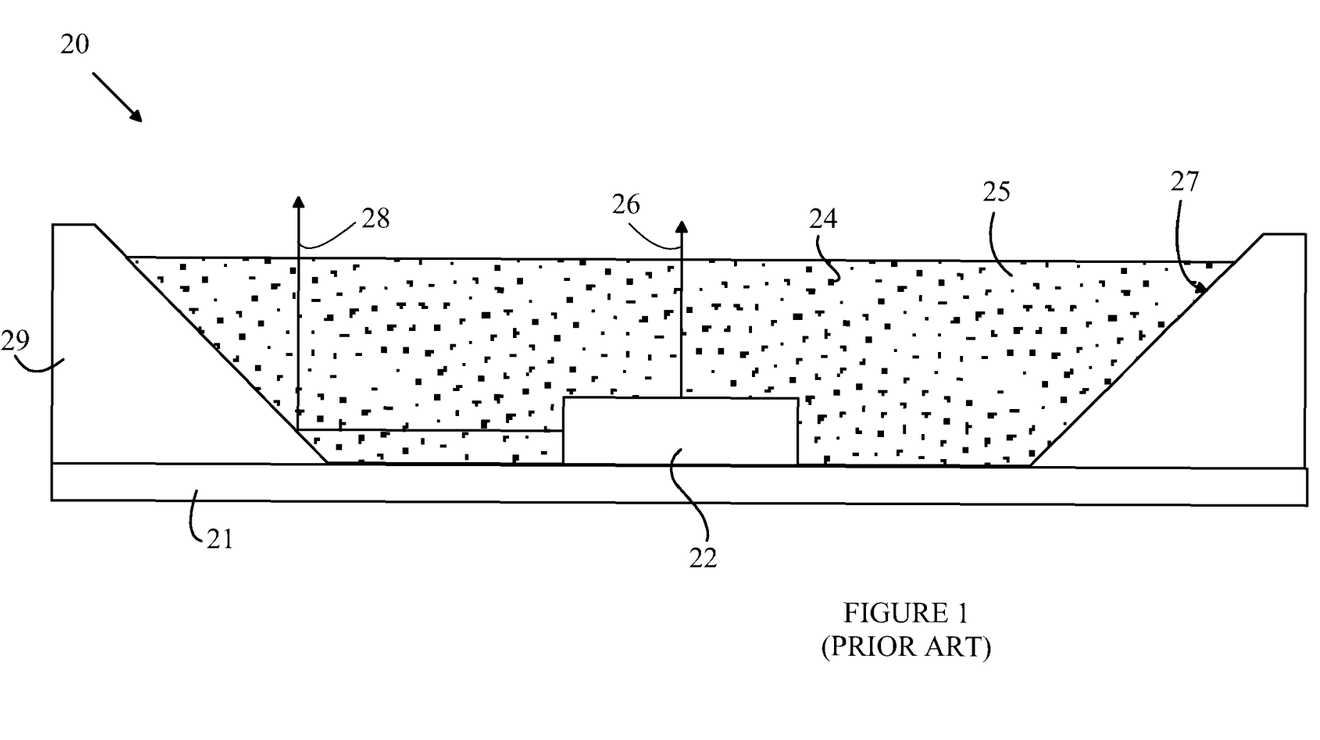
FIG. 1 is a cross-sectional view of a typical prior art phosphor converted LED source.

The manner in which the present invention provides its advantages can be more easily understood with reference to FIG. 1, which is a cross-sectional view of a typical prior art phosphor converted LED source 20. A light emitting semiconductor die 22 containing an LED is mounted within a cavity on a substrate 21. The LED is powered by contacts on the bottom side of die 22 that are connected to corresponding conductors on substrate 21. To simplify the drawing, the connections between die 22 and the conductors on substrate 21 have been omitted.

Light source 20 includes a cup 29 having reflecting sides 27. Cup 29 can be generated by boring a conical hole in a layer of material that is then bonded to substrate 21 after the walls of the hole are coated with a reflecting material. The cup is typically bonded to substrate 21 before die 22 is connected to substrate 21. However, embodiments in which the cup is created by boring a conical recess in substrate 21 are also known to the art.

After die 22 is bonded to substrate 21, a suspension of phosphor particles 24 in a carrier material 25 is introduced into cup 29. The carrier material is typically an epoxy or silicone; however, carriers based on other materials are also known to the art. The carrier is typically cured to produce a solid material in which the phosphor particles are immobilized. Even if the phosphor particles are uniformly dispersed in the carrier material when the carrier is cured, the light 28 leaving the sides of die 22 passes through a different amount of phosphor than the light 26 leaving the top surface of the die. Typically, a higher fraction of the light leaving the side of the die is converted to yellow compared to the light leaving the top of die. Hence, the light reflected from the walls of the cup is shifted in wavelength toward the yellow, which causes the light source to appear to be a circular source with a white center and a yellow halo.

Furthermore, the uniformity of the light source from device to device depends on both the accuracy with which the carrier material is dispensed into each cup as well as the concentration of phosphor in the carrier. In this regard, it should be noted that the phosphor in the dispensing reservoir is subject to settling during the course of constructing a number of light sources and hence, the concentration of phosphor particles in the carrier can vary over the course of dispensing carrier material into a number of light sources.

Figure 2:
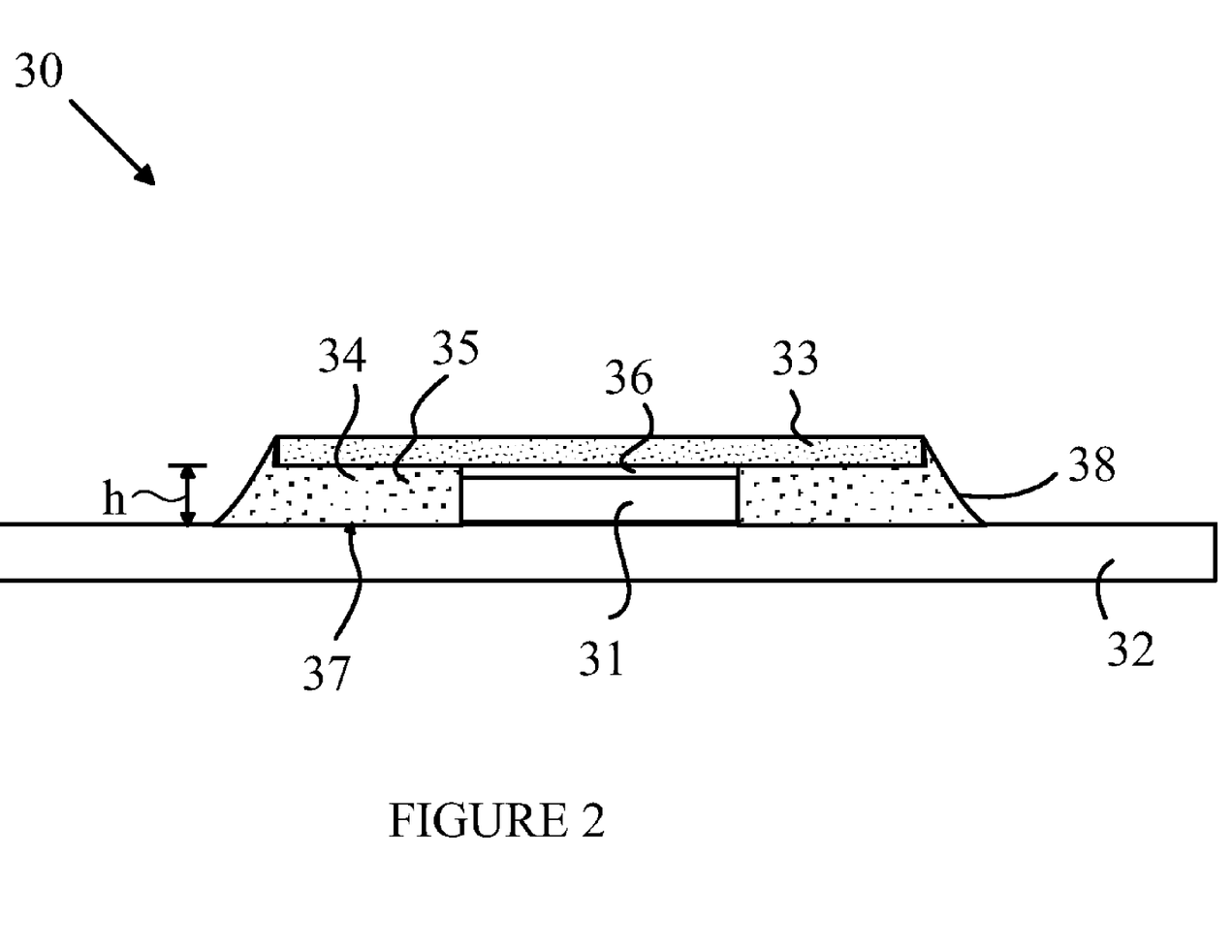
FIG. 2 is a cross-sectional view of a light source according to one aspect of the present invention.

Refer now to FIG. 2, which is a cross-sectional view of a light source according to one aspect of the present invention. Light source 30 includes a die 31 having an LED that emits light both through the top surface of die 31 and through the side surfaces of die 31. Die 31 is bonded to substrate 32 by contacts on the bottom surface of die 31. To simplify the drawing, the electrical connections between die 31 and substrate 32 have been omitted from the drawing.

A layer 33 of phosphor is bonded to the top surface of die 31 by a layer of adhesive 36. Layer 33 converts a portion of the light emitted by die 31 to light having a different spectrum from that emitted by die 31. As noted above, a white light source can be constructed by using a die that emits light in the blue region of the spectrum and a phosphor that converts blue light to yellow light. However, the present invention can be practiced with other die and phosphor combinations. As will be explained in more detail below, layer 33 can be prefabricated prior to bonding layer 33 to die 31. Layer 33 may include discrete phosphor particles suspended in a carrier or be constructed from a soluble phosphor that is dissolved in the carrier.

Light leaving the side surfaces of die 31 is scattered by a layer of scattering particles 35 that are suspended in a layer 34 of material that is transparent to the light generated by die 31. Layer 34 forms a scattering ring that surrounds the side surfaces of die 31 and fills the gap between substrate 32 and layer 33 in the region adjacent to die 31. The thickness of the scattering ring is chosen such that the amount of light that leaves the die through the side surfaces and exits through the side surface 38 of layer 34 is negligible compared to the light leaving the light source through the top surface of layer 33. In one aspect of the present invention, the amount of light leaving the side surface of die 31 that exits light source 30 through the side surface 38 of layer 34 is less than 10% of the light leaving the sides of the die that exits light source 30 through the top surface of layer 33.

The top surface 37 of substrate 32 can be covered with a reflective material that redirects any light that is scattered toward substrate 32 back toward layer 33. The scattering particles replace the conventional reflector discussed above. Consider the light that leaves the side of die 31 and is scattered such that the light is redirected to layer 33. This light passes through the same thickness of phosphor as light that is emitted from the top surface of die 31; hence, the light source has a substantially more uniform appearance than the prior art light sources discussed above. In addition, the overall lateral size of the light source can be significantly smaller than light sources that utilize separate reflectors.

As will be explained in more detail below, the height, h, of layer 34 can be set such that layer 34 can be created by introducing a liquid precursor in which scattering particles are suspended between layer 33 and substrate 32 after layer 33 has been bonded to die 31. This aspect of the invention assures that the carrier and scattering particles are limited to the underside of layer 33. The width of the scattering layer is not critical provided the width is greater than a minimum width. The width needs to be sufficient to assure that most of the light leaving the side surface of die 31 is reflected. In addition, the width must be larger than the wavelength of the light that is being redirected by the scattering particles. If additional material is present, it will not substantially change the apparent size or color of the light source, since most of the light will have already been scattered prior to reaching the additional material. Hence, the quantity of material that must be dispensed near to the edge of layer 33 need not be precisely controlled.

It should be noted that any variations in the density of scattering particles will alter the apparent diameter and intensity distribution at the edge of the light source; however, the color of the source will remain constant since the thickness of phosphor through which the light passes is independent of the scattering medium. Since the eye is more sensitive to differences in color than small differences in intensity, small differences in intensity at the edge are, in general, acceptable.

Figure 3:
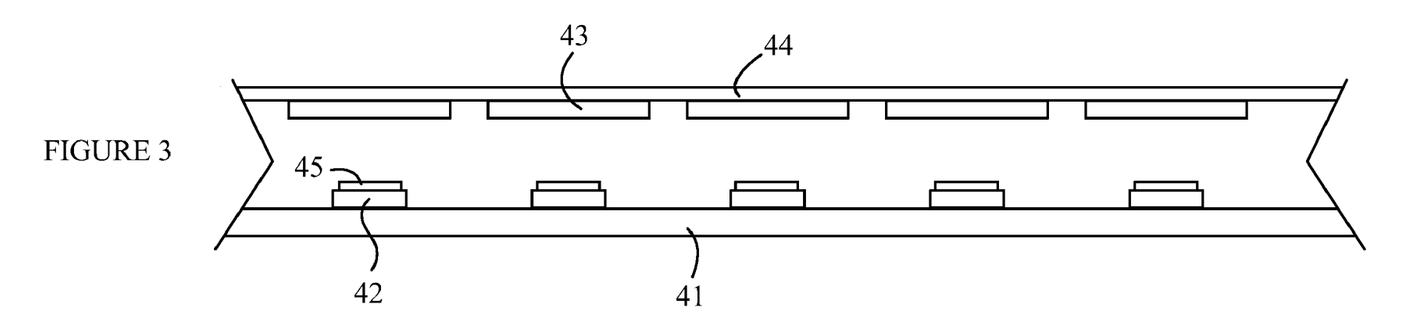
FIGS. 3-4 are cross-sectional views of a light source according to one aspect of the present invention at various stages in the fabrication process.
Figure 4:
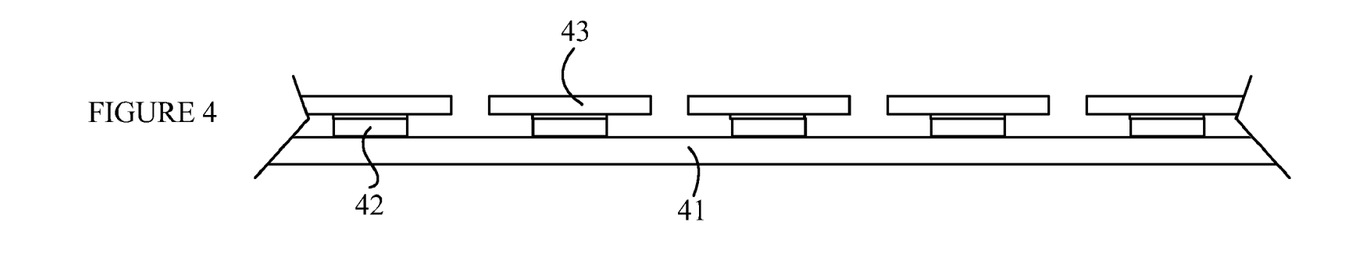
Figure 5:
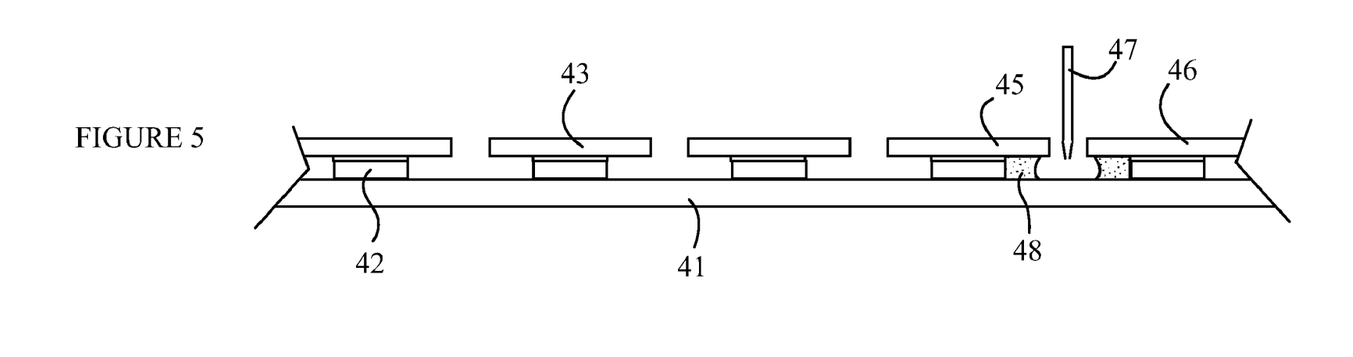
FIG. 5 is a cross-sectional view through line 5-5 shown in FIG. 6.
Figure 6:
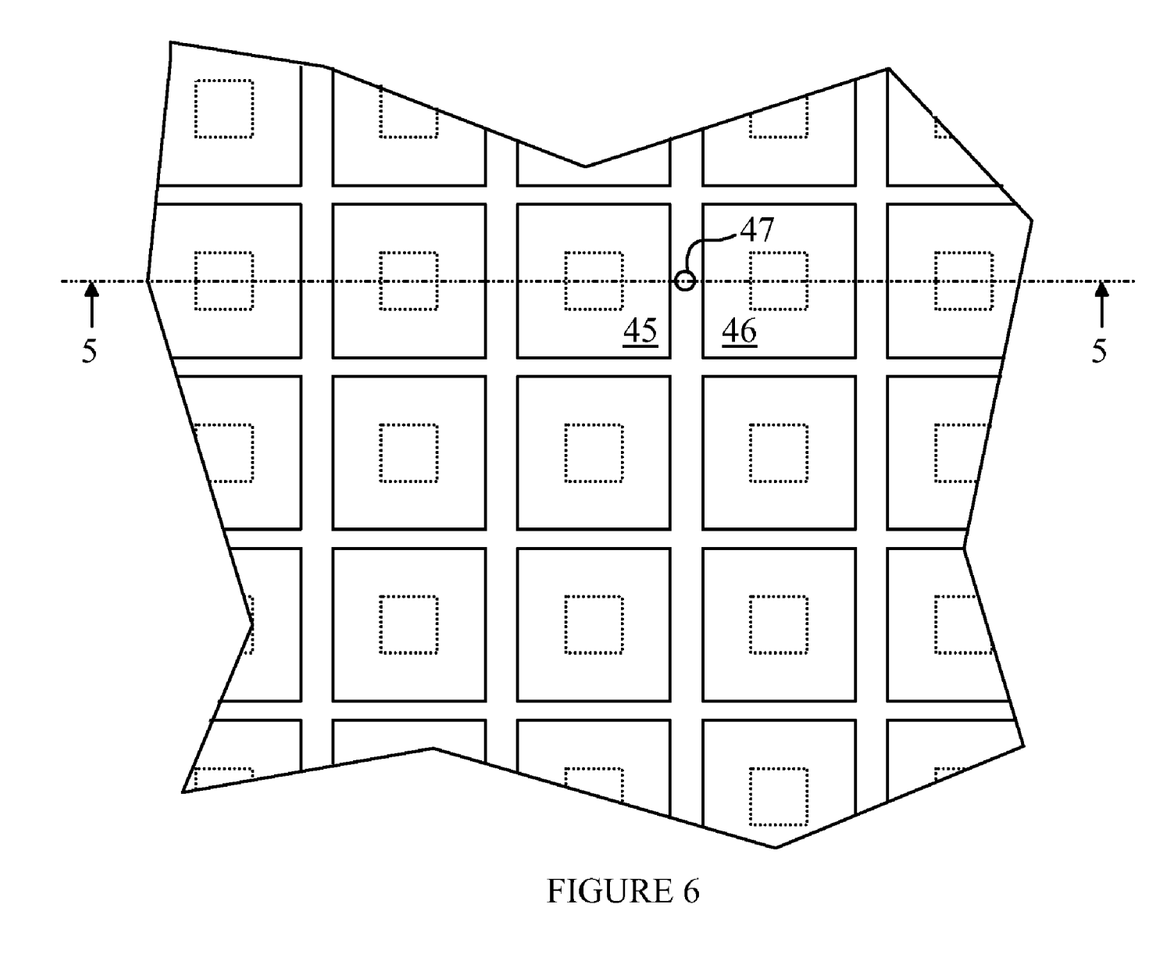
FIG. 6 is a top view of the portion of substrate shown in FIG. 5.

The manner in which a light source according to one aspect of the present invention is fabricated can be more easily understood with reference to FIGS. 3-6, which illustrate the fabrication of a number of such light sources. FIGS. 3-5 are cross-sectional views of a portion of a substrate 41 at various stages in the fabrication process. FIG. 6 is a top view of the portion of substrate 41 shown in FIG. 5, FIG. 5 being a cross-sectional view through line 5-5 shown in FIG. 6.

Referring to FIG. 3, the process begins by bonding a number of dies such as die 42 to substrate 41. The dies are connected to traces on the surface of substrate 41 and emit light from the sides of the dies and the side opposite to substrate 42. The light-emitting surface is covered by an adhesive layer 45 that is transparent to the light emitted by the dies when the adhesive is cured.

The phosphor layer is prefabricated to form discrete phosphor components 43 that are reversibly bonded to a carrier substrate 44. In one aspect of the present invention, the phosphor components can be cast as a sheet of material that is divided into individual phosphor components that are then attached to substrate 44. In another aspect of the present invention, a liquid precursor material having the phosphor is applied to substrate 44 as a patterned layer having the individual phosphor components correctly positioned on substrate 44. The precursor can be applied by a "printing operation" such as a stencil process or dispensed using a mechanism analogous to that used in ink jet printers. The precursor material is then cured to provide the phosphor components discussed above.

The phosphor components are positioned such that one phosphor component will be aligned over each die when the carrier substrate 44 is properly aligned with substrate 41. After substrates 41 and 44 are properly aligned with one another, the substrates are pressed together such that the phosphor components are brought into contact with the adhesive layers. The adhesive is then cured to provide a bond between each phosphor component and the corresponding die. After the adhesive is cured, substrate 44 is removed leaving the light source as shown in FIG. 4.

Refer now to FIGS. 5 and 6. After the phosphor components have been bonded to the dies, scattering layers 48 are formed by dispensing an appropriate precursor liquid through the spaces between the phosphor components. The precursor liquid includes the scattering particles and has a surface tension chosen such that the liquid is drawn into the space between the phosphor components and substrate 41 by capillary action. The liquid can be dispensed by a single nozzle 47 that is inserted between pairs of phosphor components such as phosphor components 45 and 46 shown in FIGS. 5 and 6. Alternatively, the precursor and scattering particle suspension can be dispensed by multiple nozzles operating in parallel.

The precursor liquid must remain in the liquid state until the liquid is drawn into the space between the phosphor components and substrate 41. The precursor liquid can be any material that will harden into a transparent medium that will maintain the scattering particles in suspension. The medium must be transparent to the light emitted by the dies. Compositions used to maintain the phosphor particles in suspension while dispensing the phosphor layer into the reflecting cups discussed above could be utilized. Such compositions typically include a carrier with various additives that slow the settling of particles. For example, compositions based on clear epoxy resins that are cured with heat or UV light could be utilized. Compositions based on silicone could also be utilized.

In one aspect of the present invention, the scattering particles are titanium oxide particles having a diameter greater than the wavelength of the light emitted by the dies. However, other materials could be utilized. For example, clear particles that have an index of refraction significantly different from that of the medium used to suspend the particles could be utilized. Glass particles suspended in epoxy could, for example, be utilized.

The phosphor components can be constructed by a number of methods. The phosphor components can be premolded from the same materials as used to construct the phosphor layers in the prior art methods discussed above. Since the phosphor components are generated in a separate molding process, the problems discussed above with respect to providing a uniform layer are substantially reduced. As noted above, the phosphor components can also be created by printing the phosphor material onto a carrier.

The phosphor components require that the distribution of phosphor particles in the horizontal direction be constant so that light leaving the top surface of the die or leaving the scattering particles will pass through the same thickness of phosphor material. However, unlike the prior art devices, the vertical distribution of phosphor particles in the phosphor components can be substantially non-uniform, since the fraction of light converted by the phosphor is relatively independent of the distribution of phosphor particles in the layer. Hence, if a molding process is utilized to provide the phosphor components, the molding process does not need to provide a curing time that is short compared to the settling time of the particles in the carrier used to suspend the particles. Similarly, if a stencil or printing process is used to dispense the phosphor onto a carrier, the fraction of the light converted is primarily determined by the amount of phosphor that is applied, as opposed to the vertical distribution of the phosphor within the layer. Finally, the preparation of the carrier with the phosphor components thereon can be separated from the packaging process, and hence, the process can be separately optimized.

The above-described examples of light sources according to various aspects of the present invention utilize a fabrication scheme in which the individual phosphor components are provided on a carrier sheet and are then transferred to the dies. In some applications, it is advantageous to include additional optical components on top of the phosphor layer to reduce the amount of light that is trapped in the phosphor layer due to internal refraction of the light at the boundary between the phosphor component and the air surrounding the finished light source. These optical components require a curved surface that complicates the bonding of the individual phosphor components to the carrier.

In one aspect of the present invention, these problems are substantially reduced by bonding a prefabricated sheet of phosphor components having the optical components in place, to the dies on the die carrier. The scattering material is then introduced into the spaces between the dies and the phosphor components as discussed above. Finally, the phosphor sheet is singulated simultaneously with the singulation of the dies and die carriers to provide the completed LEDs.

Figure 7:
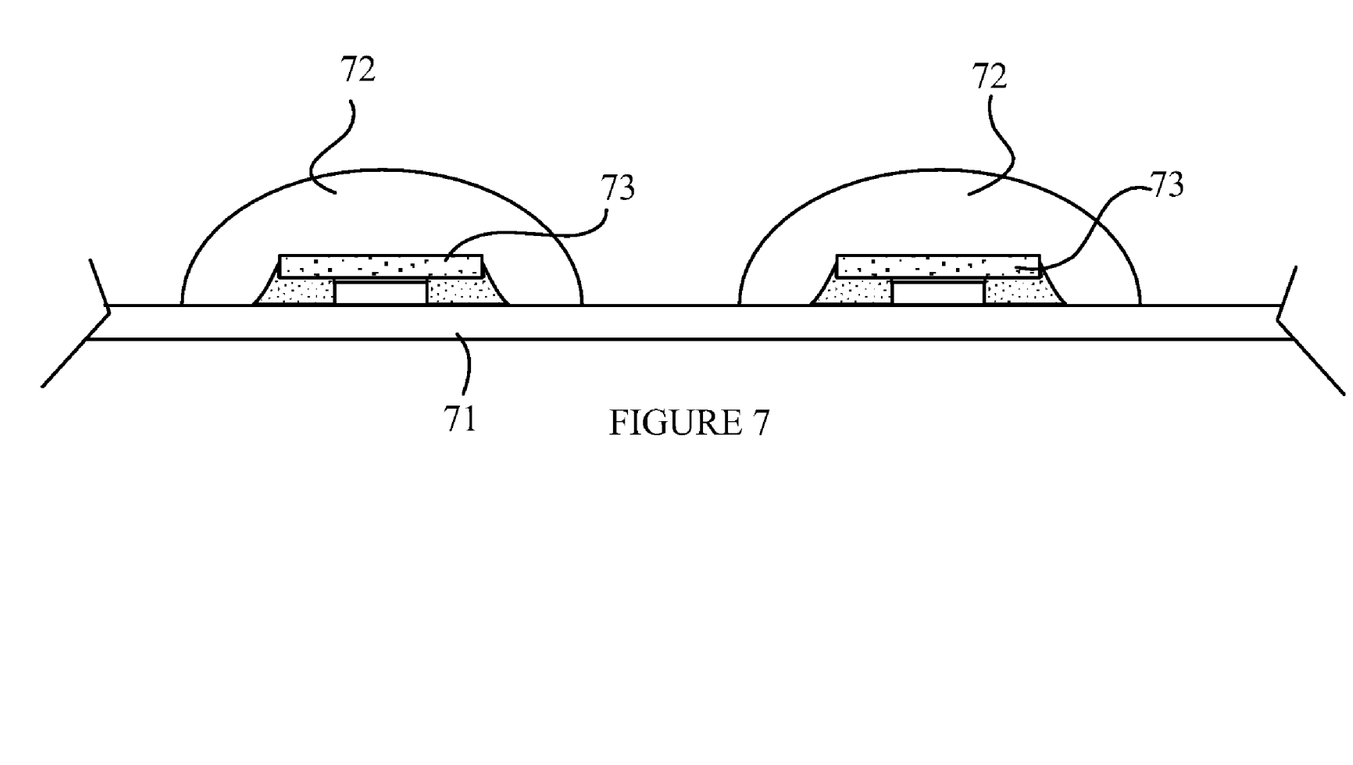
FIG. 7 is a cross-sectional view of a portion of a substrate 71 having two light sources that utilizes this aspect of the present invention.

It should be noted that the optical elements can also be fabricated by molding a dome over each of the completed light sources. Refer now to FIG. 7, which is a cross-sectional view of a portion of a substrate 71 having two light sources that utilizes this aspect of the present invention. Each light source includes a dome 72 that is molded over the phosphor component 73 in each light source. The diameter of dome 72 is chosen such that light that enters dome 72 from phosphor component 73 will strike the surface of dome 72 at angles that are less than the critical angle of dome 72, and hence, this light will escape dome 72 rather than be trapped in dome 72 by internal reflection due to the air/dome interface. The domes for an entire sheet of light sources can be molded in a single molding operation prior to singulating the individual light sources to reduce the cost of fabrication.

The above-described examples utilize a phosphor conversion layer that is fabricated by suspending phosphor particles in a transparent medium. However, the phosphor components can be constructed using other schemes. For example, a phosphor conversion layer constructed from a single crystal semiconductor material suitably doped to have fluorescent properties could be utilized for the phosphor conversion layer.

The single crystal phosphor can be grown using bulk crystal growth methods such as the Czochralsky method or epitaxial methods such as liquid or vapor phase epitaxy. For example, U.S. Pat. No. 4,873,062, issued Oct. 10, 1989 describes an apparatus and method for growing single crystals by this method. Since this method is well known in the semiconductor materials industry, it will not be discussed in detail here. For the purpose of this discussion, it is sufficient to note that a single-crystal phosphor is grown by lowering a single seed into a crucible having molten phosphor material. The bulk crystal is pulled from the molten material as the crystal grows. The bulk crystal is then sliced into thin layers and cut or broken into smaller pieces suitable for the use of this invention. The thickness of the layer depends on the particular application. A thickness between 0.05 to 5 mm, and more preferably 0.25 mm may be used in a number of applications.

As the single-crystal phosphor layer is transparent, it does not impede the transmission of light due to scattering from phosphor particle boundaries. Since the light conversion phosphor layer has a uniform thickness, the color conversion effect is the same across the surface.

The choice of crystal material depends on the specific application. For white LEDs, the LED emits light in a first band and the light conversion layer converts a portion of that light to light in a complementary band. For example, white LEDs in which the LED that emits blue light, can utilize a suitable single-crystal phosphor comprising Yttrium Aluminum Garnet activated by cerium, YAG:Ce which converts blue light to yellow light. Similarly, LEDs that emit cyan (blue-green) can be matched with a single crystal phosphor that emits red to provide a light source that appears to be white.

It should be noted that multiple phosphor layers could also be utilized. For example, if a UV-emitting LED is utilized, at least two phosphors are needed to provide a source that is perceived as being white by an observer. In this case, the phosphor layer may include two separate phosphor layers, one for each phosphor. Each phosphor layer converts a portion of the UV light. To provide the maximum efficiency, all of the UV light should be converted by the combination of phosphors.

Figure 8:
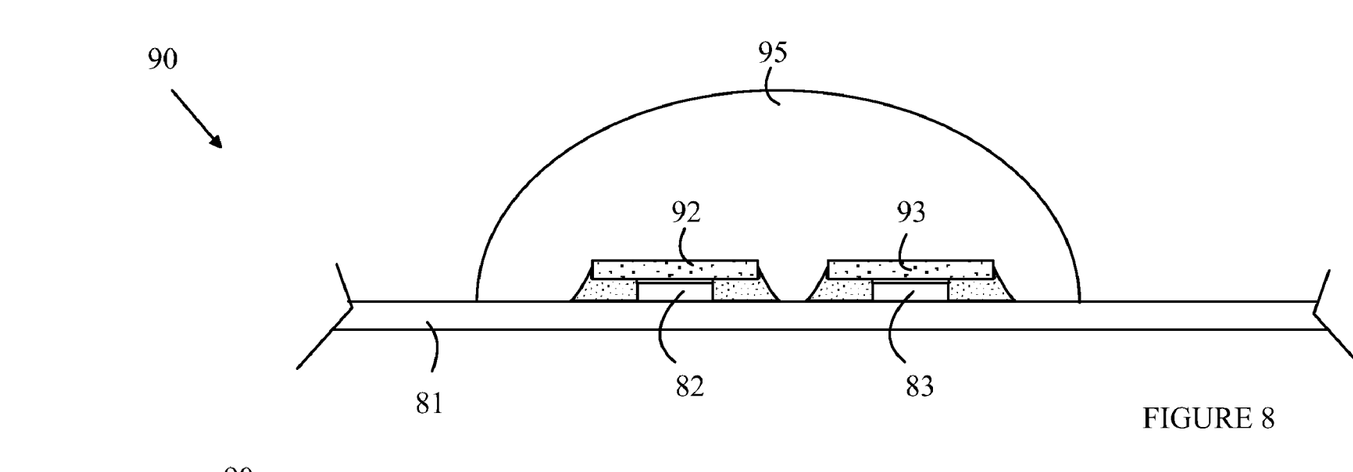
FIGS. 8 and 9 illustrate a light source that utilizes another aspect of the present invention.
Figure 9:
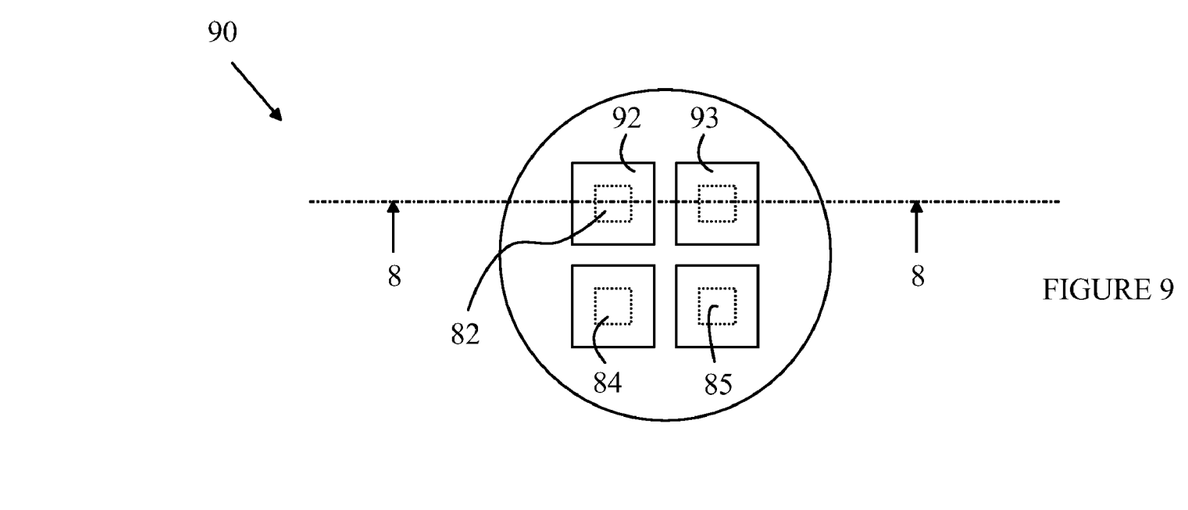

Light sources based on different color LEDs are also used to produce light that is perceived to be of a specific color by a human observer. For example, light sources based on three LEDs in which each LED generates light of a different color, e.g., red, green, and blue are often used to provide a source that can be programmed to provide light that is perceived as being of a specific color that can be chosen from a wide range of colors. The perceived color of the source is altered by altering the ratio of intensities of the three component color light sources. Light sources based on larger numbers of different colors are also known. Such light sources have a larger gamut of colors that can be generated by varying the intensities of the individual LEDs. Refer now to FIGS. 8 and 9, which illustrate a light source that utilizes this aspect of the present invention. FIG. 9 is a top view of light source 90, and FIG. 8 is a cross-sectional view of light source 90 through line 8-8 shown in FIG. 8. Light source 90 includes 4 dies shown at 82-85. Each die is covered by a phosphor component that utilizes a different phosphor. Exemplary phosphor components are labeled at 92 and 93 in the drawings. The four dies are covered by a common dome 95 in a manner analogous to that discussed above.

To provide the appearance of a "point" light source of the desired color, the LEDs must be located as close to one another as possible. The present invention is also well adapted for fabricating such light sources since the dies can be located closer together than dies in light sources in which each die is in a separate reflecting cup.

In such a light source, different phosphors are used to construct the phosphor components that cover neighboring dies in the sheet of light sources. Fabrication techniques based on printing or stenciling of the phosphors onto a carrier are well suited for this type of light source. After the light sources have been fabricated, the sheet is divided such that three or four dies with the corresponding phosphor components are contained in each light source.

Figure 10:
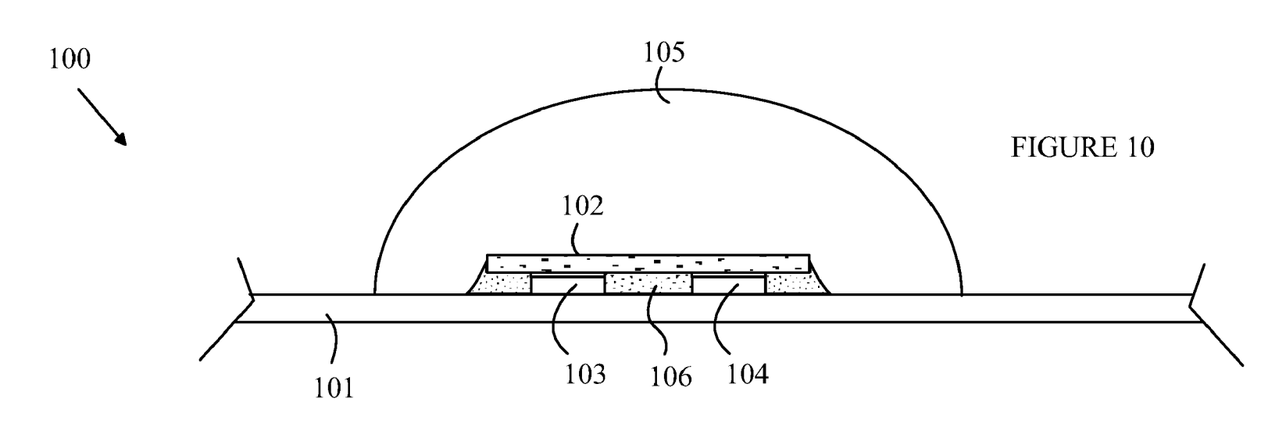
FIGS. 10 and 11 illustrate a light source that utilizes a still further aspect of the present invention.
Figure 11:
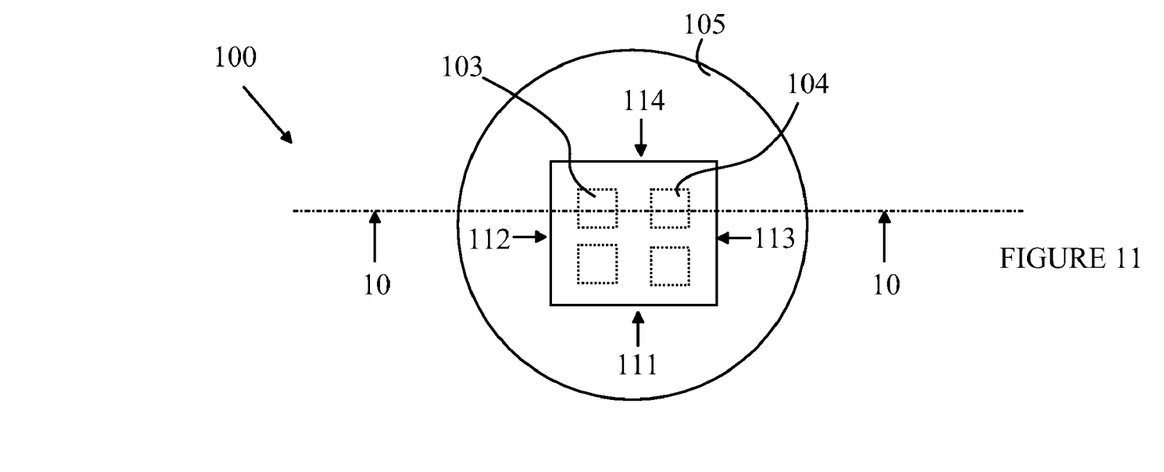

Another problem faced by LED-based light sources is the relatively low light output of individual LEDs. At present, a single die can operate at a few watts at best. Hence, to provide a light source that is to replace a conventional incandescent source, a number of dies must be combined to provide the desired intensity even when the light source is of a constant color. Once again, the present invention is well adapted for fabricating multi-die light sources that are sufficiently compact to appear to be a point source. Refer now to FIGS. 10 and 11, which illustrate a light source 100 that utilizes this aspect of the present invention. FIG. 11 is a top view of light source 100, and FIG. 10 is a cross-sectional view of light source 100 through line 10-10 shown in FIG. 11. Light source 100 utilizes 4 dies that share a common phosphor component 102.

Exemplary dies are labeled at 103 and 104 in the drawings. The dies and phosphor component are enclosed in a dome 105 to provide increased light extraction efficiency. The scattering media that redirects the light leaving the sides of the dies is introduced at the locations shown at 111-114 and moves to the areas between the dies via capillary action. Hence, the dies can be placed close to one another without losing the light that exits through the sides of the dies.

As noted above, the phosphor components are preferably fabricated using a separate process such as transfer molding, injection molding, printing, or casting. In one aspect of the present invention, the phosphor is mixed with a transparent medium such as epoxy, silicone, polycarbonate, acrylic, polyurethane, polypropylene, or similar plastics or polymers and then formed into the desired shape by molding, casting, printing or other suitable process. Inorganic glass of a low melting point can also be used as the transparent medium.

The phosphor is preferably a material that does not present the scattering problems. To minimize the scattering of the light in light sources that utilize particles of an inorganic phosphor suspended in a transparent medium, the particle size is preferably chosen to be less than or equal to the wavelength of the light emitted by the LED on the die. Alternatively, a luminescent material that is soluble in the transparent medium could be utilized. For example, an organic luminescent material such as a fluorescent dye can be utilized.

The scattering from the surface of the particles can also be reduced by an appropriate choice of the transparent medium in which the particles are suspended. In particular, a material having an index of refraction that more nearly matches that of the phosphor material can be utilized, thereby reducing the light scattering. For example, a low melting point glass can be utilized as the casting material to reduce the difference in index of refraction between the phosphor particles and the casting material.

The above-described examples of the present invention have been directed to light sources that emit light that is perceived to be "white" by the observer. However, the present invention can be utilized to construct other light sources that operate by converting a portion of the light emitted by a primary light source utilizing a phosphor.

The above-described examples of light sources according to the present invention utilize phosphors for converting light generated by the LED to light of a different wavelength. However, other forms of luminescent materials could be utilized. In general, any material that converts light of the wavelength generated by the LED to light of the desired wavelength could be utilized.

The above-described examples of a light source according to the present invention refer to various components as being transparent. For the purposes of the present invention, a medium is defined to be transparent if that medium transmits more than 90 percent of the light generated by the LED in the light source.

Various modifications to the present invention will become apparent to those skilled in the art from the foregoing description and accompanying drawings. Accordingly, the present invention is to be limited solely by the scope of the following claims.

What is claimed is:

1. A light source comprising:
a die that emits light of a first wavelength through a top surface of said die and one or more side surfaces of said die, said die being bonded to a surface of a mounting substrate;
a light conversion component comprising a layer of luminescent material that converts light of said first wavelength to light of a second wavelength, said light conversion component having a bottom surface bonded to said top surface of said die, said light conversion component having lateral dimensions such that a space exists around said die, said space being bounded by said substrate and said light conversion component; and
a scattering ring surrounding said side surfaces of said die and being positioned in said space such that a portion of said light emitted from said side surfaces of said die is scattered into said light conversion component by said scattering ring,
wherein said scattering ring comprises a transparent material having particles suspended therein, and wherein said transparent material has a liquid precursor that wets said bottom surface of said light conversion component and said mounting substrate and wherein said space has dimensions that cause said liquid precursor to be drawn into said space by capillary action.

2. The light source of claim 1 wherein said transparent material comprises an epoxy.

3. The light source of claim 1 wherein said transparent material comprises silicone.

4. The light source of claim 1 wherein said particles comprise titanium oxide.

5. The light source of claim 1 wherein said light conversion component comprises a transparent material having particles of a phosphor suspended therein.

6. The light source of claim 1 wherein said light conversion component comprises a single crystal of phosphor having a lateral dimension equal to the lateral dimension of said light conversion component.

7. The light source of claim 1 wherein said light conversion component comprises a planar layer of transparent material having a luminescent material therein and a light processing layer comprising a layer of transparent material bonded to said planar layer, said light processing layer having a non-planar surface overlying said planar layer, wherein said light processing layer does not comprise scattering particles.

8. The light source of claim 1 further comprising a layer of transparent material over said mounting substrate shaped to provide an optical component having a non-planar surface corresponding to said die, wherein said layer of transparent material does not comprise scattering particles.

* * * * *